US010175320B2

(12) United States Patent
Zenge

(10) Patent No.: US 10,175,320 B2
(45) Date of Patent: Jan. 8, 2019

(54) CONTROLLING A MAGNETIC RESONANCE IMAGING SYSTEM TO GENERATE MAGNETIC RESONANCE IMAGE DATA OF AN EXAMINATION SUBJECT

(71) Applicant: Siemens Aktiengesellschaft, Munich (DE)

(72) Inventor: Michael Zenge, Nuremberg (DE)

(73) Assignee: Siemens Aktiengesellschaft, Munich (DE)

(*) Notice: Subject to any disclaimer, the term of this patent is extended or adjusted under 35 U.S.C. 154(b) by 803 days.

(21) Appl. No.: 14/510,415

(22) Filed: Oct. 9, 2014

(65) Prior Publication Data
US 2015/0097563 A1    Apr. 9, 2015

(30) Foreign Application Priority Data

Oct. 9, 2013 (DE) .................. 10 2013 220 326

(51) Int. Cl.
*G01R 33/48* (2006.01)
*G01R 33/561* (2006.01)
(Continued)

(52) U.S. Cl.
CPC ....... *G01R 33/482* (2013.01); *G01R 33/3852* (2013.01); *G01R 33/543* (2013.01);
(Continued)

(58) Field of Classification Search
CPC .............. G01R 33/482; G01R 33/3852; G01R 33/543; G01R 33/5611; G01R 33/5614; G01R 33/56325
See application file for complete search history.

(56) References Cited

U.S. PATENT DOCUMENTS 6,275,038 B1 * 8/2001 Harvey ............ G01R 33/56563
324/307
7,592,808 B1   9/2009 King
(Continued)

OTHER PUBLICATIONS

Lustig et al: "Sparse MRI: The Application of Compressed Sensing for Rapid MR Imaging", Magnetic Resonance in Medicine 58; pp. 1182-1195, (2007).
(Continued)

*Primary Examiner* — Susan S Lee
(74) *Attorney, Agent, or Firm* — Schiff Hardin LLP

(57) ABSTRACT

In a method to control a magnetic resonance imaging system to generate magnetic resonance image data of an examination subject, raw magnetic resonance data are acquired that include measurement values at multiple readout points in k-space. The readout points are arranged along a readout axis in k-space as readout pairs with a predetermined pair spacing relative to one another. Readout pairs that are adjacent in k-space along the readout axis have a sampling interval that is different than the pair spacing, which sampling interval varies along the readout axis. A control sequence determination system is designed to determine a control sequence for a magnetic resonance imaging system that is designed to control the magnetic resonance imaging system according to this method, and a magnetic resonance imaging system that has a control device designed to control the magnetic resonance imaging system according to such a method.

26 Claims, 5 Drawing Sheets

(51) Int. Cl.
G01R 33/54 (2006.01)
G01R 33/385 (2006.01)
G01R 33/563 (2006.01)

(52) U.S. Cl.
CPC ...... *G01R 33/5611* (2013.01); *G01R 33/5614* (2013.01); *G01R 33/56325* (2013.01)

(56) References Cited

U.S. PATENT DOCUMENTS

| | | | |
|---|---|---|---|
| 9,632,160 B2* | 4/2017 | Grodzki | G01R 33/543 |
| 2001/0008376 A1* | 7/2001 | Mock | G01R 33/56554 |
| | | | 324/307 |
| 2008/0252290 A1 | 10/2008 | Doyle | |
| 2013/0082704 A1* | 4/2013 | Grodzki | G01R 33/5659 |
| | | | 324/309 |
| 2015/0015255 A1* | 1/2015 | Krueger | G01R 33/5676 |
| | | | 324/309 |

OTHER PUBLICATIONS

Bieri et al.., "Analysis and Compensation of Eddy Currents in Balanced SSFP"; Magnetic Resonance in Medicine, 2005, vol. 54, pp. 129-137, (2005).

Jung et al., ;"k-t Focuss: A General Compressed Sensing Framework for High Resolution Dynamic MRI"; Magnetic Resonance in Medicine; 61.103; (2009).

Zenge et al: "Applications Guide—CV_sparse: Triggered 2D real-time CINE featuring compressed sensing and k-t regularization"; Release 760, Sep. 2012.

* cited by examiner

CONTROLLING A MAGNETIC RESONANCE IMAGING SYSTEM TO GENERATE MAGNETIC RESONANCE IMAGE DATA OF AN EXAMINATION SUBJECT

BACKGROUND OF THE INVENTION

Field of the Invention

The invention concerns a method for controlling a magnetic resonance imaging system to generate image data of an examination subject, a control sequence determination system to determine such a control sequence, and a magnetic resonance imaging system designed for operation according to such a method.

Description of the Prior Art

Imaging systems that make use of a magnetic resonance measurement (signals originating from nuclear spins) are known as magnetic resonance tomography systems and have been successfully established and proven for a multitude of applications. In this type of image acquisition, a static basic magnetic field BO, which serves for initial alignment and homogenization of magnetic dipoles that are to be examined, is superimposed with a rapidly switched magnetic field (known as the gradient field) for spatial resolution of the imaging signal. To determine material properties of an examination subject to be imaged, the dephasing or relaxation time of the nuclear spins is determined after a deflection of their magnetization out of the initial alignment, such that different relaxation mechanisms or relaxation times, which are typical to the material, can be identified. The deflection most often takes place by radiating a number of RF pulses, and the spatial resolution is based on a chronologically established manipulation of the deflected magnetization with the use of the gradient field in a collection of pulses known as a measurement sequence, or control sequence, which establishes a precise chronological sequence of RF pulses, the change of the gradient field (by switching a sequence of gradient pulses) and the detection of measurement values.

An association between the measured magnetization, from which the noted material properties can be derived, and a spatial coordinate of the measured magnetization in the spatial domain in which the examination subject is situated, typically takes place with the use of an intermediate step. In this intermediate step, acquired raw magnetic resonance data are entered at readout points in a memory organized in an arrangement known as "k-space", wherein the coordinates of k-space are coded as a function of the gradient field. The magnitude of the magnetization (in particular the transverse magnetization, defined in a plane transverse to the basic magnetic field) at a defined location of the examination subject can be determined from the data of the readout point, through a Fourier transformation that calculates the signal strength of the signal in the spatial domain from a signal strength (magnitude of the magnetization) that is associated with a defined frequency (the spatial frequency) or phase position.

The gradient field (in particular a characteristic thereof known as the gradient moment) defines a point in k-space, and the curve of the gradient field establishes a series of k-space points that can be designated as a "trajectory" through k-space, or also a "projection" in k-space.

Most often, k-space is scanned (filled by data entries made therein) as a series of readout points (known as sampling), with the distances between the readout points usually being predetermined according to the Nyquist-Shannon condition, and in addition are most often uniformly distributed in k-space. According to the Nyquist-Shannon sampling theorem, a sampling rate of k-space is predetermined for a defined, sought number of image points in each region of the subject (i.e. in the spatial domain) that is to be imaged (i.e. a desired spatial resolution of the image data). The minimum time between sampling events that results from adherence to a strict Nyquist-Shannon sampling rate can, in certain situations, be severely limiting, for example if the generation of image data of a moving examination subject is sought. For example, this can be the case for image data of a heart. A particularly fast acquisition of the magnetic resonance data can be required for a type of image presentation known as a CINE acquisition, for example if a "balanced steady state free precession" (bSSFP) magnetic resonance signals should be acquired as image information (raw magnetic resonance data that are acquired with a bSSFP method are designated in the following as "bSSFP raw data" for short). Often, a low spatial resolution is therefore selected in order to acquire bSSFP raw data.

Therefore, it would be desirable to be able to acquire image data more quickly with a predetermined quality (i.e. in particular with a predetermined spatial resolution), than with the minimum time determined via the Nyquist condition.

SUMMARY OF THE INVENTION

An object of the invention is to provide a procedure to quickly implement the acquisition of the raw magnetic resonance data to reconstruct image data with a predetermined quality.

This object is achieved by a method according to the invention for controlling a magnetic resonance imaging system to generate magnetic resonance image data of an examination subject, in particular a moving examination subject, wherein raw magnetic resonance data (in particular bSSFP raw data) are acquired, the raw magnetic resonance data including measurement values for multiple readout points in k-space. The readout points are arranged as readout pairs with a predetermined pair spacing relative to one another along a readout axis (in particular in a readout direction) in k-space. The readout direction follows a spatial direction of a Cartesian coordinate system in k-space. The readout axis is an axis that travels parallel to the phase coding direction in k-space. The phase coding direction is typically designated as the ky-direction of k-space.

As used herein, a readout pair is a pair of readout points that are adjacent along the readout axis in k-space, the readout points being situated at the pair interval (i.e. a distance in k-space). For example, a distance in k-space can be a phase interval of two readout points in k-space in the phase coding direction, i.e. as the difference of their respective k-values or k-space coordinates along the readout axis, which can be analogously calculated with regard to their spatial difference in three-dimensional positional space.

Such a readout pair is doublet of adjacent readout points—in particular readout points in immediate chronological succession—acquired along the readout axis ky. The pair spacing along the readout axis therefore establishes a first sampling factor or a first sampling rate of k-space along the readout axis.

According to the invention, readout pairs that are arranged adjacently in k-space along the readout axis, in particular readout pairs acquired along the readout axis that follow one another in immediate chronological succession, have a sampling interval that is different from the pair interval. The sampling interval thereby varies along the readout axis. In other words, at least three readout pairs (i.e. a first, second and third readout pair) are acquired along the readout axis, with the first readout pair having a different sampling interval from the second readout pair than the second readout pair has from the third readout pair. This sampling of k-space along the readout axis to acquire the raw magnetic resonance data can be considered as a type of sampling known as sparse sampling.

The sampling interval is determined by the distance in k-space between two readout pairs, wherein in particular the distance between the respective middle points of a readout pair in k-space—i.e. the middle position between two readout points of the respective readout pair—and the middle position of a readout pair acquired following immediately chronologically afterward, can be considered. However, in the following the distance in k-space of the chronologically first (as acquired in the readout direction) readout points of the respective adjacent readout pairs is equivalently considered as a sampling interval. The sampling interval thus determines an additional, second sampling factor along the readout axis that defines the mentioned sparse sampling. The sampling of k-space preferably takes place at least with a sampling interval that is greater than this would be provided by the Nyquist condition. This can also be referred to as under sampling.

For example, a reconstruction of an image information on the basis of the readout points generated in such a manner can take place as described in the article "Sparse MRI: The Application of Compressed Sensing for Rapid MR Imaging", Magnetic Resonance in Medicine 58: 1182-1195 (2007) by M. Lustig, D. Donoho and J. M. Pauly. In the method described therein, bSSFP raw data are likewise acquired but with the disadvantage that strong eddy currents occur due to the sparse sampling, which leads to unwanted artifacts in the reconstructed image data.

The invention is based on a new type of sparse sampling, namely the sparse sampling of readout pairs instead of a sparse sampling of individual readout points. Eddy current effects can thereby advantageously be minimized by a defined pair sampling of the readout points, in particular in the case of bSSFP magnetic resonance data. This first constant sampling factor along the readout direction (i.e. the pair interval) enables the use of a second sparse sampling factor (i.e. of the sample spacing) without the image quality being negatively affected. This means that a significant acceleration of the acquisition of the raw magnetic resonance data can be achieved without notable quality losses with regard to the generated image data. In particular, the sampling rate of k-space can be selected that is lower overall than this is provided by the Nyquist-Shannon sampling theorem.

The raw magnetic resonance data acquired according to the invention satisfy the following conditions:

The association of the measurement values with readout points takes place with what is known as an "incoherent sample spacing", meaning that multiple different sampling intervals of readout pairs occur along the readout axis.

The data to be reconstructed can be shown in what is known as a "sparse depiction", for example a wavelet or JPEG depiction with few coefficients.

The reconstruction can be understood as a "nonlinear optimization problem".

Furthermore, the invention also includes a method to control a magnetic resonance imaging system to generate magnetic resonance image data of an examination subject, wherein a readout axis is associated with a region in k-space that is associated with an examination subject in a spatial region. In the method, raw magnetic resonance data associated with first readout points along the readout axis in k-space are also acquired at a first point in time according to the described method according to the invention. Magnetic resonance image data are reconstructed using the acquired first readout point. At a second, later point in time, preferably after execution of the method according to the invention as described above, raw magnetic resonance data associated with second readout points along the cited readout axis in k-space are acquired. For the readout axis, and therefore for the same spatial region of the examination subject, the arrangement of the first readout points in k-space differ from the arrangement of the second readout points. Furthermore, magnetic resonance image data are reconstructed using the raw magnetic resonance data arranged at the second readout points. The reconstruction of the image data can take place independently of the raw magnetic resonance data of the first readout points, as well as on the basis of a raw magnetic resonance data set that includes both the raw magnetic resonance data of the first readout points and the second readout points. This means that, for example, initially k-space that includes a time axis is filled, and then the raw data in k-space are subjected to a corresponding multidimensional Fourier transformation to reconstruct image data. These are advantageously at least three-dimensional or even four-dimensional raw magnetic resonance data from which the chronological development of a slice or of a thicker volume of the examination subject can be determined, for example.

This method, in which a different sampling in k-space to generate image data for the same spatial region of an examination subject is respectively used at different times, can be used advantageously in the generation of CINE image data. In particular in faster time series, magnetic resonance image data of the same slice (thus multiple exposures of the same spatial region) of the examination subject are thereby created. These can then be presented in quick succession so that in particular movements (of a heart, for example) can be viewed as a movie. Most often, the measurement of the raw magnetic resonance data and their presentation as magnetic resonance image data take place nearly in real time. The invention enables a nearly real-time acquisition of the raw magnetic resonance data given high quality of the generated image data due to the increased speed of the data acquisition. In particular, a "sparse sampling" is likewise additionally used in the time dimension of the acquired raw magnetic resonance data. Over a chronological series of multiple readout axes that are preferably associated with the same spatial region, "incoherency" thus likewise occurs in the time dimension. The "incoherency" in this context pertains to the number of readout axes proceeding identically in k-space until a readout point along a readout axis that is acquired later in time is associated again with the same k-space readout axis that was sampled earlier. This number thus varies for a particular readout point of a readout axis relative to another readout point that is situated along the same readout axis (chronological incoherence).

Furthermore, the invention concerns a control sequence determination system designed to determine a control sequence for a magnetic resonance imaging system, the control sequence determination system being designed so that the magnetic resonance imaging system is controlled according to a method according to the invention. This determination system can be present as a separate assembly, or can be integrated into a magnetic resonance imaging system.

The invention also encompasses a magnetic resonance imaging system having a control device designed to control the magnetic resonance imaging system according to the method according to the invention. In particular, the control device can operate using a control sequence generated with a control sequence determination system according to the invention so that the magnetic resonance imaging system is controlled with the control sequence. The control sequence determination system can be part of the control device.

Significant portions of the control sequence determination system and preferably realized in the form of software at a suitable programmable computer, for example a medical imaging system or a terminal with corresponding storage capabilities. A realization largely in software—in particular of the control sequence determination system—has the advantage that control sequence determination systems or medical imaging systems or the like that have already previously been in use can be retrofitted in a simple manner via a software update in order to operate in the manner according to the invention.

The above object thus is also achieved by a non-transitory, computer-readable data storage medium that can be loaded directly into a memory of a control sequence determination system, a control device or a magnetic resonance imaging system, with program code segments in order to implement the required steps of the above method when the program is executed in the control sequence determination system, the control device or, respectively, the magnetic resonance imaging system.

The multiple different (i.e. varying) sampling intervals are preferably established along the readout axis according to an arrangement rule. In particular, there can be a combination of multiple arrangement rules.

For example, it is possible for a region around a central point of the readout axis to be acquired with a higher sampling rate than a region of the readout axis that is arranged further distant from the central point. This means that the "incoherency" increases towards the edge of k-space or, respectively, the readout axis. In particular a point with a center coordinate that coincides with a coordinate of a k-space center (thus for example a point of the ky-axis with the value ky=0) is thereby designated as a central point of the readout axis. The point preferably lies precisely in the middle of the ky-axis. Given these different sampling rates depending on distance from the central point—i.e. sampling intervals—in particular the realization is taken into account that a significant information about the magnetization excited in the examination subject is associated with the region of the k-space center because the primary information of the Fourier transformation, in the form of the amplitude of the lowest-frequency fundamental mode of the raw magnetic resonance data, lies in the k-space center. Most often, this is also the point of the readout axis with which the highest intensity of a magnetic resonance signal can be associated. The sampling of the peripheral regions of k-space can thus take place with a lower sampling rate (i.e. a greater sampling interval) than in the region of the readout axis that lies closest to the k-space center. For example, the arrangement rules can be based on a Gaussian function. This means that the sampling intervals can vary along the readout axis (i.e. in a readout direction) according to a—preferably reciprocal—Gaussian function. In particular, the arrangement rules can be chosen so that the maximum point of the Gaussian function which indicates the sampling interval as a function of k-space coordinates along the readout axis lies in peripheral regions of the readout axis, and the minimum point of the Gaussian function lies in a region of the readout axis that is situated next to the center of k-space, for example as this can quickly be functionally described with a reciprocal Gaussian function. It can therefore be said that the density of the readout points is greatest at the central point or, respectively, in the region of the central point.

For example, the arrangement rules can also be based on a linearly progressing interval function. This means that the sampling interval can, for example, be based on a defined point of the readout axis, linearly growing or shrinking via the linearly progressing interval function.

In particular, as mentioned a central point with a center coordinate that coincides with a coordinate of a k-space center can be associated with the readout axis, and arrangement rules can be selected so that the sampling interval (between adjacent readout pairs) increases with increasing distance (in k-space) from the central point. Conversely, it can be said that the density of the readout points increases along the readout axis toward the central point.

For example, in combination with the use of a linear sampling function as an arrangement rule, a lower sampling rate (in particular lower than as provided by the Nyquist theorem) can thus be established in a simple manner, which allows a reconstruction of image data with a predetermined spatial resolution.

The sampling interval may also be incoherent or chosen to be asymmetrical, or can increase. For example, this means that the arrangement rule is chosen so that multiple sampling intervals are chosen to be asymmetrical relative to the central point, and thereby in particular the incoherency (thus the sampling intervals) increase with distance from the central point. "Asymmetrical relative to the central point" means that a magnitude of an interval relative to the central point along the readout axis can be found in which only a single readout pair is arranged, for example meaning that only a single readout pair lies in this found interval, to the left and right of the central point. In other words: at least one "asymmetrical readout pair" exists which is defined in that no additional readout pair occurs along the readout axis in the same interval (with regard to the magnitude of said interval) relative to the central point.

As noted, multiple arrangement rules can be applied along the readout axis. Different arrangement rules are thereby preferably applied for different segments along the readout axis. For example, a first arrangement rule can provide uniform sampling intervals, in particular in a first segment along the readout axis, and a second arrangement rule can provide varying sampling intervals along the readout axis, in particular in a second segment that is different than the first segment.

For example, the first arrangement rule can be applied in a segment in the region of the central point of the readout axis, and the second arrangement rule can be applied in a segment of the readout axis that is further distant from the central point (i.e. a peripheral segment). If the central point does not lie in a border region of k-space sampled along the readout axis, but rather lies in the middle of the readout axis, for example, the two peripheral segments of k-space that then occur along the readout axis can in particular be sampled according to the second arrangement rule.

A particularly effective combination of multiple arrangement rules that takes into account that a primary information in the acquisition of raw magnetic resonance data is associated with the k-space center can, for example, is for a constant sampling interval to occur in the region of the central point, in particular across multiple readout pairs along the readout axis, and only in a peripheral region of the readout axis is the sampling interval increased, for example linearly or according to a Gaussian function (thus incoherently).

An additional acceleration of the acquisition of the raw magnetic resonance data can be achieved by an arrangement rule that is based on what is known as a "partial Fourier method". For this, the arrangement rule can be chosen so that readout points are arranged along the readout axis in a readout direction starting only respectively from a region around the noted central point of the readout axis or, respectively, the central point itself, in a direction outward. This direction does not necessarily need to coincide with the readout direction. The realization is thereby utilized that k-space is point-symmetrical relative to the k-space center. This means that—starting from the central point—readout points acquired along the in a direction along the readout axis, and the associated raw magnetic resonance data, can be associated with k-space in a mirrored fashion to reconstruct the image data at the central point. The acquisition of measurement values can thus be limited to one quadrant of k-space, and the acquisition of the raw magnetic resonance data can be markedly accelerated.

This development thus concerns a method in which a central point with a center coordinate that coincides with a coordinate of a k-space center is associated with the readout axis; the readout axis has a first segment along which multiple readout pairs are acquired and a second segment which is determined via mirroring of the first segment at the central point (k0) that is free of readout points. In particular, as noted raw data of readout pairs that are arranged along the first segment in k-space can be arranged mirrored at the central point again to k-space with correspondingly mirrored coordinates [sic] to generate the magnetic resonance image data.

Furthermore, the arrangement rule can be based on a pseudorandom method. This means that the variation and modification of the sampling interval according to the arrangement rule takes place quasi-randomly, thus reproducibly, deterministically and not really randomly, thus based on a pseudorandom rule. For this, for example, the sampling interval can be calculated with the use of a pseudorandom generator. For example, the pseudorandom generator can be embodied in the mentioned control sequence determination system, the control unit or the magnetic resonance imaging system. The deterministic specification of the sampling interval (which in this case can form the pseudorandom rule) can then, for example, take place using a "linear shift register" of the pseudorandom generator. For example, simple design rules exist for this purpose that allow the realization of a pseudorandom generator in an efficient manner.

Alternatively or in combination, the pseudorandom rule or the sampling interval can be provided using a "modulo shift register" of the pseudorandom generator, wherein the division ratio (i.e. the modulo divisor of the shift register) is provided by the golden section of the length in k-space of the segment of the examination subject that is to be acquired along the readout axis, which would likewise be easy to realize, for example.

The use of the pseudorandom principle enables raw magnetic resonance data to be generated that allow a sparse depiction with a limited number of presentation coefficients that is smaller than the number of readout points that is provided for the readout axis by the Nyquist-Shannon sampling theorem, such that an undersampling of k-space is therefore possible.

DESCRIPTION OF THE PREFERRED EMBODIMENTS

Figure 1:
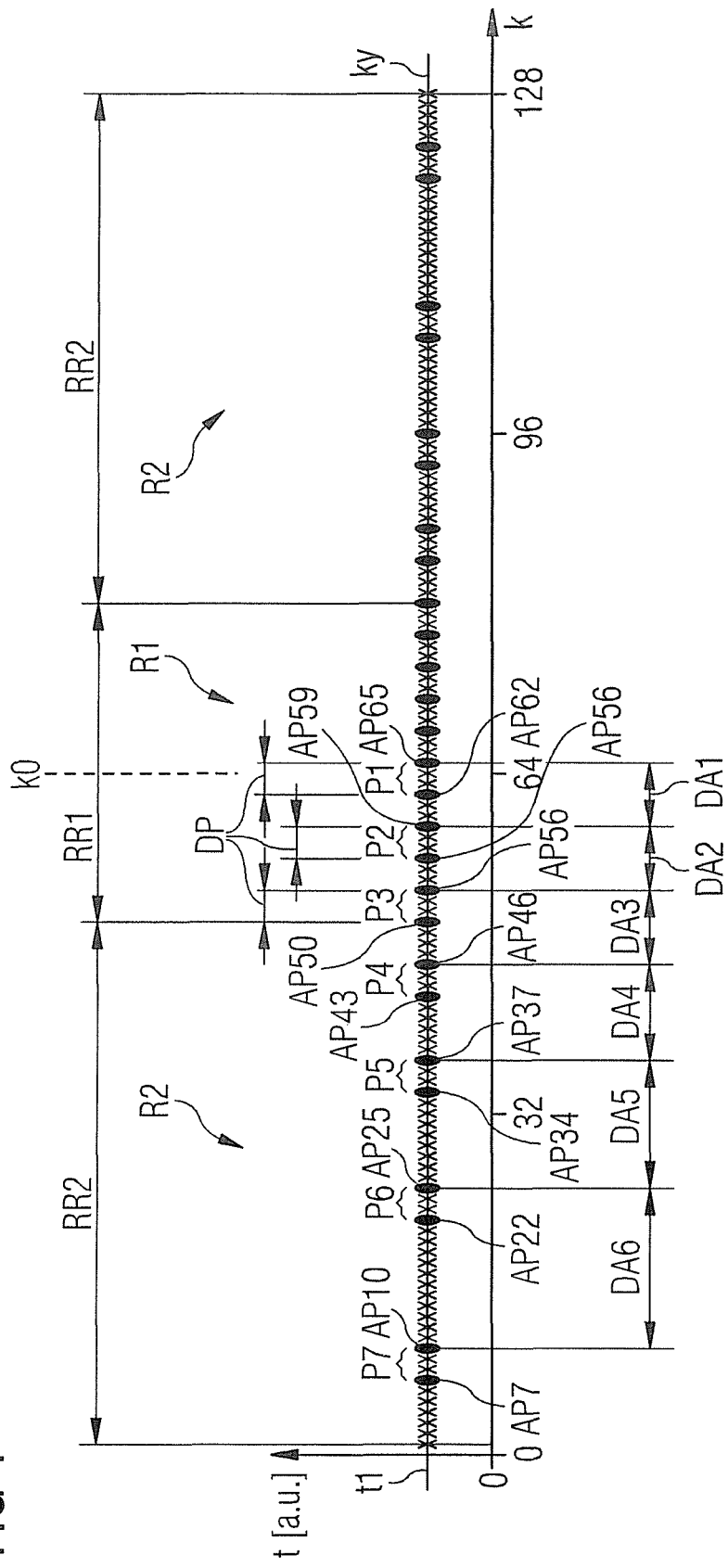
FIG. 1 shows an exemplary embodiment of a readout axis along which k-space is sampled according to the invention.

FIG. 1 shows a readout axis ky that proceeds in k-space orthogonally to a trajectory for sampling of k-space to acquire raw magnetic resonance data of an examination subject. In this, as in all further exemplary embodiments, magnetic resonance signals should be acquired according to a bSSFP method.

Figure 5:
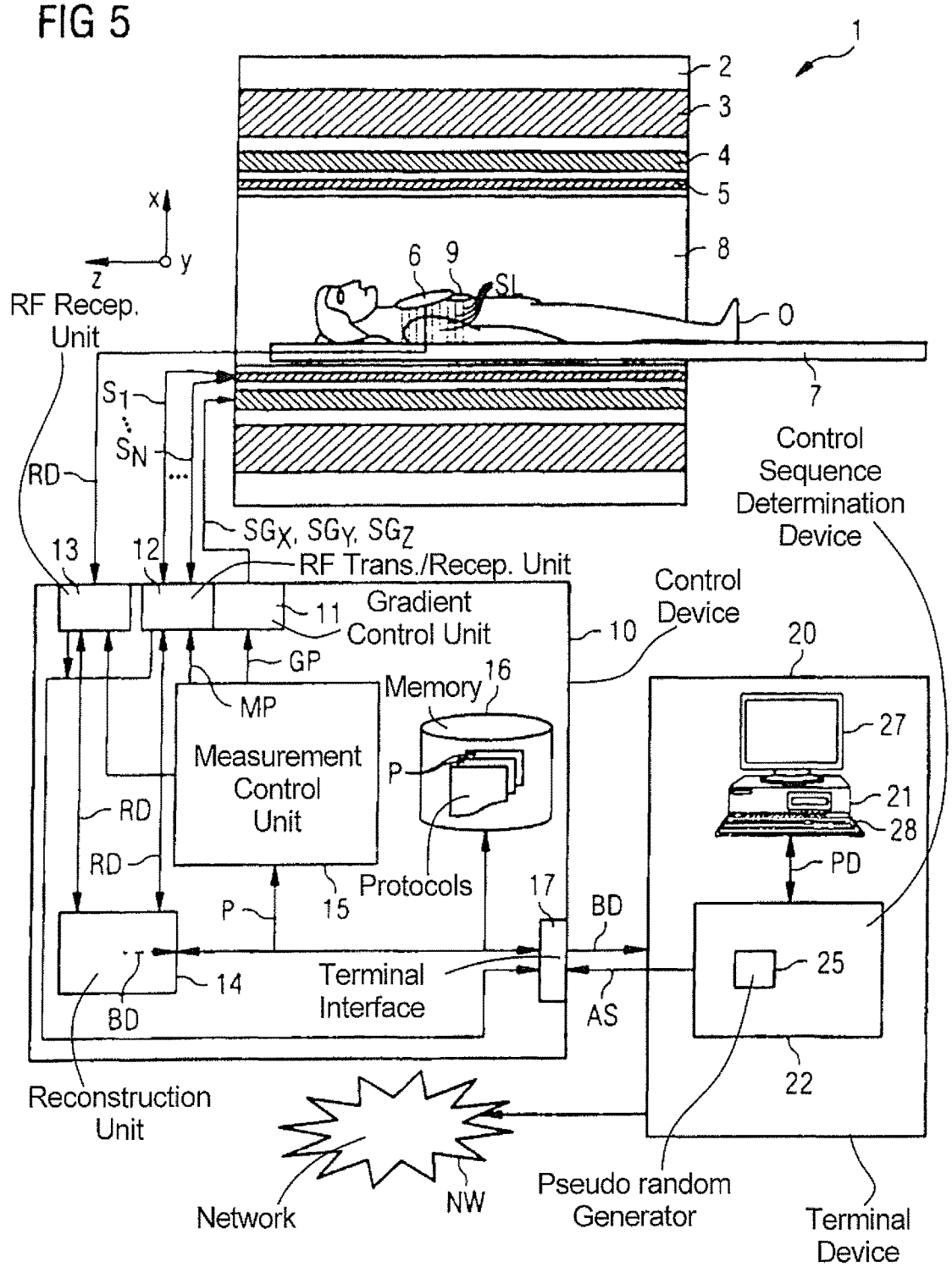
FIG. 5 is a schematic depiction of a magnetic resonance imaging system with an exemplary embodiment of a control sequence determination system according to the invention.

As is apparent in contribution with FIG. 5, the examination subject O is situated in the measurement space 8 of a magnetic resonance imaging system 1 to acquire raw magnetic resonance data RD. The spatial coding of the raw magnetic resonance data RD ensues as is typical in k-space, which is associated with spatial regions of the examination subject O (and therefore of the measurement space 8) via a Fourier transformation.

FIG. 1 shows the chronological order of the sampling of k-space along a readout axis ky. The readout axis ky proceeds parallel to the ky-direction of k-space, i.e. parallel to the frequency coding direction. As previously noted, the raw magnetic resonance data or measurement data that are acquired along the readout axis are initially associated with k-space in an intermediate step. Each of the points marked with a cross "X" corresponds to the same k-space value in the frequency coding direction orthogonal to the phase coding direction (i.e. the same kx-value). In this exemplary embodiment, as in all further exemplary embodiments, the sampling of k-space takes place along trajectories arranged in parallel that in particular travel parallel to the frequency coding direction in k-space, such that the sampling in k-space is described by a Cartesian coordinate system.

In order to acquire image data of the examination subject with a desired spatial resolution, k-space is most often sampled with a sampling rate predetermined according to the Nyquist-Shannon sampling theorem, meaning that magnetic resonance measurement values are associated with predetermined readout points in k-space. The readout points necessary according to the Nyquist-Shannon sampling theorem for a predetermined spatial resolution, are marked as crosses ("X") in FIG. 1. However, in accordance with the present invention, actual measurement values do not need to be acquired at all readout points marked with a cross, without a reduction in the spatial resolution of the generated image data. Along the readout axis ky, measurement values are acquired only for the readout points marked with a filled circle.

Marked along the readout axis ky are examples of readout pairs P1, P2, P3, P4, P5, P6, P7 that are respectively formed from pairs of readout points AP7, AP10, AP22, AP25, AP34, AP37, AP43, AP46, AP50, AP53, AP56, AP59, AP62, AP65 acquired in immediate chronological succession along the readout axis (the numbering of the reference characters of the readout points thereby takes place from left to right, corresponding to the readout direction of the readout axis; the numerical value of the numbering thereby corresponds to the continuously progressing numbering in this direction of the readout points marked with a cross which would be necessary according to the Nyquist-Shannon sampling theorem. The readout points AP7, AP10, AP22, AP25, AP34, AP37, AP43, AP46, AP50, AP53, AP56, AP59, AP62, AP65 of a readout pair P1, P2, P3, P4, P5, P6, P7 are respectively identically spaced from one another in k-space and thus have a pair interval DP that is identical for each readout pair P1, P2, P3, P4, P5, P6, P7 along the readout axis ky. For reasons of clarity, the pair interval DP is only indicated for the readout pairs P1, P2, P3 in FIG. 1.

The considered readout axis ky can be subdivided into multiple segments RR1, RR2 in which k-space is respectively sampled based on different arrangement rules R1, R2 for readout pairs or, respectively, readout points. A first segment RR1 is thereby arranged in a region of a central point k0 of the readout axis ky, and second segments RR2 are arranged further distant from the central point k0, in two peripheral regions of the readout axis ky and k-space that respectively directly adjoin the first readout segment RR1 in k-space. The central point k0 has a coordinate in k-space that coincides with a coordinate of the center of k-space. In the typical nomenclature of three-dimensional k-space matrix, the center of k-space has the coordinates (0, 0, 0), meaning that the "zero" k-values are respectively associated as k-space coordinates with the k-space center in the frequency coding direction, the phase coding direction, and the slice selection direction.

The interval or the distance in k-space—thus the sampling interval DA1, DA2—between the individual readout pairs P1, P2, P3 that are respectively acquired in immediate chronological succession, which readout pairs P1, P2, P3 are arranged in a first segment R1, is thereby established by the first arrangement rule R1. In the shown case, the arrangement rule R1 establishes that raw magnetic resonance data for readout points in the region or, respectively, segment RR1 that encloses the central point k0 of the readout axis ky are acquired with a constant sampling rate of k-space. For this, as is apparent the sampling interval DA1, DA2 is chosen to be twice as large as the pair interval DP, such that the distance in k-space between the last acquired readout point AP59 of a readout pair P2 and the first readout point AP62 of an additional second readout pair P1 that is acquired immediately after this corresponds to the pair interval DP. Such a scanning or sampling of k-space in the region of the central point k0 entails the advantage that the readout points that are most important to the reconstruction—i.e. readout points that are in particular arranged in the region of extreme magnetic resonance measurement values in k-space—can be reconstructed with an established quality. Explained illustratively, a basic quality of the reconstruction can be ensured via this sampling in the region of a maximum magnetic resonance signal.

In the shown exemplary embodiment, a different arrangement rule R2 is applied in the peripheral regions or, respectively, segments RR2 of the readout axis ky. This is chosen such that the sampling interval DA3, DA4, DA5 grows with increasing distance of the readout pairs P4, P5, P6, P7 from the central point k0. This in particular enables the sought acceleration of the acquisition of the raw magnetic resonance data via an undersampling that is enhanced relative to segment RR1 as opposed to a sampling according to the Nyquist-Shannon theorem. As is apparent, the sampling interval DA3, DA4, DA5 increases linearly with the distance of the readout pairs in k-space from the central point k0. The sampling intervals DA3, DA4, DA5 are therefore not identical—these segments RR2 are sampled "sparsely" in k-space—wherein the "incoherency" of the sampling intervals increases towards the edge of k-space.

Figure 2:
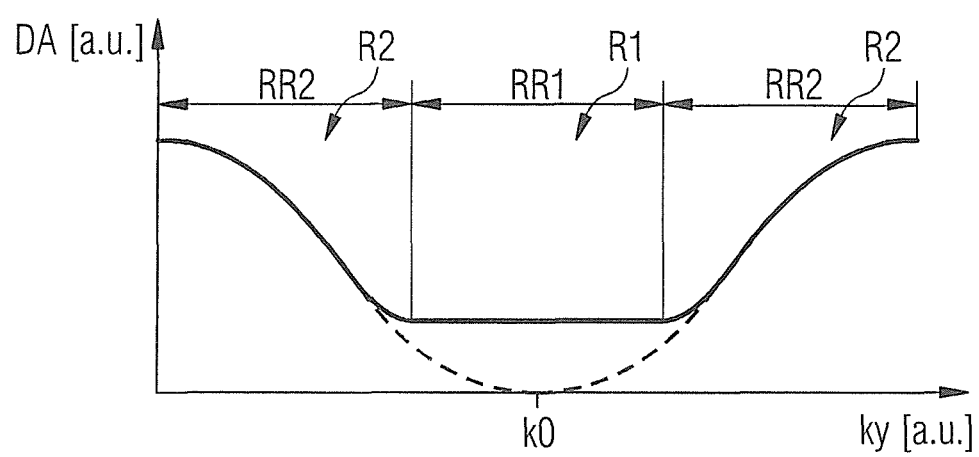
FIG. 2 schematically illustrates the graphical depiction of an arrangement rule for readout pairs using the curve of the sampling interval of readout pairs in k-space.

However, going beyond the depiction of FIG. 1, other arrangement rules R1, R2 could also be used, as this is shown in FIG. 2. In FIG. 2, the curve of the sampling interval DA is shown over the course of the readout axis ky in k-space. As explained with regard to FIG. 1, the arrangement rule R1 was thereby chosen in the region RR1 of the central point k0 so that the sampling interval DA in this segment RR1 is constant. In the shown case, as is apparent via the dashed lines the arrangement rule R2 is now based on a reciprocal Gaussian function that establishes the sampling interval DA according to the arrangement rule R1, starting from the constant value DA, so that the sampling interval DA increases in peripheral regions or, respectively, segments RR2 of the readout axis ky. A function parameter of the Gaussian function that establishes the sampling interval is thereby the distance of the respective readout pair to be arranged in a sampling interval DA from the central point k0. A reduction of the sampling of k-space that goes beyond the undersampling according to a linear arrangement function can thus be achieved in the segments RR2. The acquisition of the raw magnetic resonance data is thus further accelerated.

The reconstruction of the image data for such generated raw magnetic resonance data with a sampling interval varying along a readout axis ky can be based on a nonlinear optimization method. For example, this is described in the aforementioned document by M. Lustig et al. The undersampling is based on the sparse arrangement of readout pairs P4, P5, P6 (FIG. 1) and thereby attempts to avoid the sparse arrangement of individual readout points. For the first time, it therefore enables the invention to largely suppress the excitation of eddy current effects, even given a sparse sampling of k-space or, respectively, of the examination subject.

For reasons of clarity, the presentation of Figures is thereby limited to a single readout axis or possibly to a few readout axes. In order to obtain a slice presentation of the examination subject for the Cartesian sampling of k-space that is used in the exemplary embodiments, for a slice that is arranged parallel to the ky direction and includes the readout axis ky, multiple trajectories are sampled which are arranged orthogonal to the presented readout axis ky at a distance in k-space, which trajectories in particular run parallel to the frequency coding direction.

Figure 3:
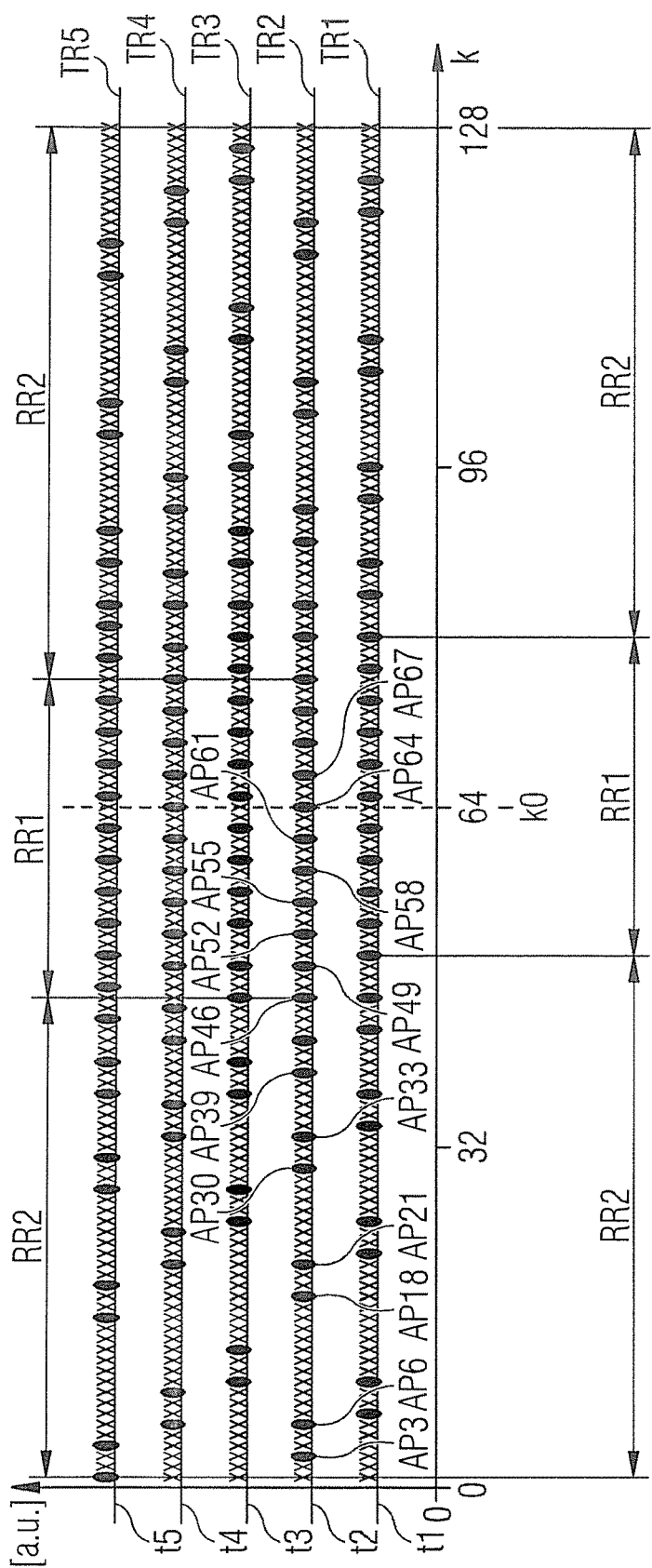
FIG. 3 is a schematic depiction of the sampling of k-space using the invention in a CINE image acquisition method using bSSFP raw data.

FIG. 3 shows the application of the method according to the invention given what is known as a CINE MRI acquisition as it is often used for function analysis of a heart, for example. Slice images of the same region of the examination subject are thereby generated in a fast series, which series can be viewed and analyzed essentially like a film ("CINE"). As an example, for clarity FIG. 3 shows a time series of a few of the multiple readout axes TR1, TR2, TR3, TR4, TR5 in k-space for the acquisition of raw magnetic resonance data of an examination subject. Each of the readout axes in turn intersects the frequency coding direction at the same frequency coding value (i.e. the same kx-coordinate). The beginning of the sampling of k-space along these readout axes takes place at different starting points in time t1, t2, t3, t4, t5, and the readout axes TR1, TR2, TR3, TR4, TR5 proceed in k-space so that respectively essentially the same region of an examination subject is acquired, but at different points in time. The arrangement of readout points along the readout axis TR1 thereby corresponds entirely to the sampling of k-space along the readout axis ky, as explained with regard to FIG. 1.

In the shown method, the arrangement of the readout points of the sampled readout axes TR2, TR3, TR4, TR5 that are started in chronological succession is thereby modified using a pseudorandom generator, starting from the arrangement rules R1 and R2 that (as described with regard to FIG. 1) are applied to segments RR1, RR2 of the readout axis TR1. As explained with regard to FIG. 1, the points of the readout axes TR2, TR3, TR4, TR5 that are marked with a cross corresponding to the readout points that would be required for a uniform sampling of k-space according to the specifications of the Nyquist-Shannon sampling theorem with a predetermined spatial resolution. In this presentation, the number of readout points according to Nyquist-Shannon ("Nyquist readout points") is used as a distance measurement in k-space along the readout axes TR1, TR2, TR3, TR4, TR5, such that the distance can also be easily determined in the presentation. As is therefore easily apparent, each of the readout axes TR1, TR2, TR3, TR4, TR5 has a segment that is sampled equidistantly—i.e. uniformly with readout points and uniform sampling interval—that is similar to the arrangement rule R1 of the readout axis TR1 (see FIG. 1, readout axis ky there). However, the arrangement of this segment RR1 in k-space is not identical for each of the readout axes TR1, TR2, TR3, TR4, TR5. The shift or position and dimension of this segment around the central point k0 of the respective readout axis TR1, TR2, TR3, TR4, TR5 is determined by a pseudorandom number generator.

Each readout axis TR1, TR2, TR3, TR4, TR5 includes a peripheral segment RR2 in which the sampling intervals DA increase with distance from the central point k0, as described with regard to the readout axis ky in FIG. 1. A scaling factor of a linear sampling function that is used as an arrangement rule for the respective readout axis is thereby determined by a pseudorandom number generator.

In this method it is to be established that at least the position of a readout point in k-space of one of the readout axes TR1, TR2, TR3, TR4, TR5 differs from a chronologically following sampled readout axis TR2, TR3, TR4, TR5. In particular, this is clear in the example of the first readout points of the readout axis TR1 (see FIG. 1) and the second readout points AP3, AP6, AP18, AP33, AP39, AP42, AP46, AP52, AP58, AP55, AP58, AP61, AP64, AP67 of the readout axis TR2. The position of none of the second readout points AP3, AP6, AP18, AP33, AP39, AP42, AP46, AP52, AP58, AP55, AP58, AP61, AP64, AP67 of the readout axis TR2 coincides with the position of one of the first readout points of the readout axis TR1. The generated raw magnetic resonance data are thus chronologically distributed "incoherently" in k-space. The acquisition of raw magnetic resonance data can therefore be designed to be more efficient, in terms of time, since—given reconstruction of image data that are based on raw magnetic resonance data that have been acquired in a chronologically incoherent matter—the possibility exists to increase the spatial undersampling, i.e. to increase the sampling intervals.

Figure 4:
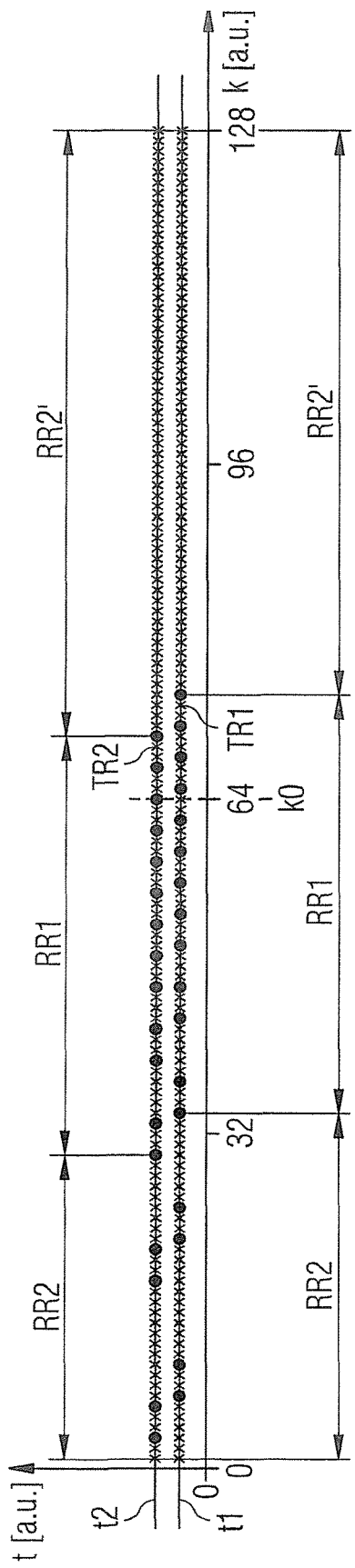
FIG. 4 is a schematic depiction of the sampling of k-space using the invention according to a "partial Fourier" method.

FIG. 4 shows a further possibility to accelerate the acquisition of raw magnetic resonance data. Thereby shown is again a series of readout axes TR1, TR2 of essentially the same segment of k-space and the same slice of the examination subject, which readout axes TR1, TR2 are started and sampled in chronological succession. As was explained with regard to FIGS. 1 and 3, the readout axes TR1, TR2 respectively include a segment RR1 in the region of the central point k0, in which segment RR1 the readout points are arranged in a uniform spacing from one another, similar to the arrangement rule R1 mentioned with regard to FIGS. 1 through 3. Each of the readout axes TR1, TR2 also has a peripheral segment R2 in which multiple readout pairs are arranged with varying sampling interval. In contrast to the exemplary embodiments of FIGS. 1 and 3, however, along the readout axes TR1, TR2 raw data in one of the peripheral segments RR2, RR2' are respectively acquired at readout points occurring outside of the segment RR1, only in addition to the raw data at the uniformly arranged readout points in the segment RR1. For each of the readout axes TR1, TR2, this segment RR2 thereby lies in the same defined quadrant of k-space that—in this case—includes segments of the readout axis TR1, TR2, starting from the central point k0, that are described with negative coordinates in the phase coding direction in k-space. It should be noted that any other preferred direction starting from the central point k0 of the readout axis TR1, TR2 could establish the quadrant of k-space. To reconstruct the image data, the raw data of the readout pair acquired in segment RR2 can also be inserted (i.e. copied), symmetrically relative to the central point k0, into the segment RR2' of the readout axis TR1, TR2 in k-space that is not sampled with readout points without thereby adulterating the image information. However, a sampling of k-space in segment RR2' using the variation of the gradient field is not required, which leads to a further acceleration of the acquisition of the raw magnetic resonance data.

The described method for acquisition of raw magnetic resonance data to generate magnetic resonance image data of an examination subject can in particular take place using a magnetic resonance imaging system 1 as it is shown in FIG. 1.

FIG. 5 schematically shows a magnetic resonance system or a magnetic resonance imaging system 1 according to the invention. The system 1 includes the actual magnetic resonance scanner 2 with a measurement space 8 or patient tunnel located therein. A bed 7 can be driven into this patient tunnel 8 so that, during an examination, an examination subject O (patient/test subject) lying thereupon can be borne at a specified position within the magnetic resonance scanner 2 relative to the magnet system and radio-frequency system arranged in the magnetic resonance scanner 2 or can also be moved between different positions during a measurement.

Basic components of the magnetic resonance scanner 2 are a basic field magnet 3; a gradient system 4 with gradient coils in order to apply arbitrary magnetic field gradients in the x-, y- and z-directions; and a whole-body radio-frequency coil 5. The reception of magnetic resonance signals induced in the examination subject O can take place via the whole-body coil 5 with which the radio-frequency signals for inducing the magnetic resonance signals are normally also emitted. However, these signals are typically received with local coils 6 and/or 9 placed on or below the examination subject O, for example. All of these components are known in principle to those skilled in the art, and therefore are shown only roughly schematically in FIG. 4.

The whole-body radio-frequency coil 5 can have a number N of individual antenna rods (for example in the form of what is known as a birdcage antenna) that are separately controllable as individual transmission channels S1, ..., SN by a control device 10, meaning that the magnetic resonance tomography system 1 is a pTX-capable system. However, it is noted that the method according to the invention is also applicable to classical magnetic resonance tomography apparatuses with only one transmission channel.

The control device 10 can be a control computer that can also be comprised of a plurality of individual computers (which are possibly also spatially separated and connected among one another via suitable bus systems or, respectively, cables or the like). This control device 10 is connected via a terminal interface 17 with a terminal 20 via which an operator can control the entire system 1. In the present case, this terminal 20 has a computer 21 with keyboard 28, one or more screens 27 as well as additional input devices (for example a mouse or the like) so that a graphical user interface is provided to the operator.

Among other things, the control device 10 has a gradient control unit 11 that can in turn be comprised of multiple partial components. The individual gradient coils are fed with control signals SGx, SGy, SGz via this gradient control unit 11. The control signals produce gradient pulses that, during a measurement, are set at precisely provided time positions and with a precisely predetermined time curve in order to scan the examination subject O and associated k-space, advantageously in individual slices SL according to a control sequence AS.

Moreover, the control device 10 has a radio-frequency transmission/reception unit 12. This RF transmission/reception unit 12 likewise comprises multiple sub-components in order to respectively feed radio-frequency pulses separately and in parallel to the individual transmission channels S1, . . . , SN, i.e. in this case to the individually controllable antenna rods of the body coil 5. Magnetic resonance signals can also be received via the transmission/reception unit 12. In this exemplary embodiment, however, this occurs with the use of the local coils 6 and/or 9. The raw data RD received with these local coils 6 and/or 9 are read out and processed by an RF reception unit 13. The magnetic resonance signals received by this, or by the whole body coil 5 by the RF transmission/reception unit 12, are passed as raw data RD to a reconstruction unit 14, which reconstructs the image data BD from these and stores these in a memory 16 and/or passes them to the terminal 20 via the interface 17 so that the operator can view them. The image data BD can also be stored and/or displayed and evaluated at other points via a network NW. Insofar as the local coils 6 have a suitable switching unit, these can also be connected to an RF transmission/reception unit 12 in order to also use the local coils to transmit, in particular in pTX operation.

The gradient coil controller 11, the RF transmission/reception unit 12 and the reception unit 13 for the local coils 6 and/or 9 are respectively controlled as coordinated by a measurement control unit 15. Via corresponding commands, this ensures that a desired gradient pulse train GPM is emitted via suitable gradient coil signals SGx, SGy, SGz and controls the RF transmission/reception unit 12 in parallel so that a multichannel pulse train MP is emitted, meaning that the radio-frequency pulses matching the individual transmission channels S1, . . . , SN are provided in parallel to the individual transmission rods of the whole-body coil 5. Moreover, it must be ensured that the magnetic resonance signals are read out at the local coils 6 via the RF reception unit 13 or, respectively, that possible signals are read out at the whole-body coil 5 via the RF transmission/reception unit 12 at the matching point in time and are processed further. The measurement control unit 15 provides the corresponding signals—in particular the multichannel pulse train MP—to the radio-frequency transmission/reception unit 12 and the gradient pulse train GP to the gradient control unit 11 according to a predetermined control protocol P. In this control protocol P, all control data are stored that must be set during a measurement according to a predetermined control sequence AS.

A number control protocols P for different measurements are typically stored in a memory 16. These can be selected by the operator via the terminal 20 and possibly be modified in order to then provide for the currently desired measurement a matching control protocol P with which the measurement control unit 15 can operate. Moreover, the operator can also retrieve control protocols P (for example from a manufacturer of the magnetic resonance system) via a network NW and can then modify and use these as necessary.

The fundamental workflow of such a magnetic resonance measurement and the cited components for control are known to those skilled in the art, and thus need not be explained in further detail herein. Moreover, such a magnetic resonance scanner 2 as well as the associated control device can still have a plurality of additional components that here are likewise not explained in detail. The magnetic resonance scanner 2 can also be of a different design, for example with a laterally open patient space, and that in principle the radio-frequency whole-body coil does not need to be designed as a birdcage antenna.

Moreover, here in FIG. 5 a control sequence determination device 22 according to the invention is schematically shown that serves to determine a magnetic resonance system control sequence AS. Among other things, for a defined measurement this magnetic resonance system control sequence AS includes a pulse sequence with a pulse train GP in order to traverse a defined trajectory in k-space, as well as a radio-frequency pulse train (here a multichannel pulse train MP) coordinated with this to control the individual transmission channels 1, . . . , SN. In the present case, the magnetic resonance system control sequence AS is created on the basis of parameters PD predetermined in the measurement protocol P, in particular according to a method described with regard to FIGS. 1 through 4. Furthermore, as is apparent, the control sequence determination device 22 has a pseudorandom generator 25 that can be used to modify the trajectories of the control sequence AS (for example as described with regard to FIG. 3). As shown, the control sequence determination device 22 can thereby be comprised in the magnetic resonance system 1, and in particular can also be a component of the control device 10. However, it is also conceivable that the control sequence determination device 22 exists externally as an independent module and is designed for use with multiple different magnetic resonance systems.

Independent of this, the magnetic resonance system 1 can be operated with the use of the control device 10 using a control sequence AS created according to the invention so that raw magnetic resonance data RD can be acquired quickly to create image data BD of an examination subject O, and so that the reconstruction of the image data BD can take place using a nonlinear optimization method. From the previous description it is clear that the invention provides effective possibilities to accelerate a method to acquire raw magnetic resonance data to generate magnetic resonance image data, in particular with a predetermined spatial resolution.

The term "unit" as used herein does not preclude the appertaining components from including multiple sub-components that can possibly also be arranged distributed in space.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance (MR) imaging apparatus, comprising:
   in a processor, determining a control sequence to operate an MR data acquisition scanner with an examination subject situated therein, to acquire raw magnetic resonance data from the examination subject that include measurement values for multiple readout points in k-space;
   in said processor, determining said control sequence in order to cause said raw magnetic resonance data to be entered into an electronic memory organized as k-space at said readout points arranged along a readout axis in k-space, as readout pairs, each comprised of two of said measurement values respectively at two of said readout points, with a defined sparse sampling in k-space defined by said readout points in each readout pair having a same predetermined pair spacing relative to each other, and by readout pairs that are adjacent along said readout axis in k-space having a sampling interval that is different from said pair spacing, with said sampling interval varying along said readout axis;
   from said processor, making said control sequence available in electronic form as control signals and operating said MR data acquisition scanner according to said control signals in order, during an execution of said control sequence, to acquire said measurement values and to enter said measurement values in said memory organized as k-space, with said defined sparse sampling, with said execution of said control sequence having a shorter time duration than execution of said control sequence without said defined sparse sampling; and
   from said processor, accessing contents of said memory organized as k-space and executing a reconstruction algorithm that processes said contents to generate MR image data of the examination subject from said contents, and making said MR image date available in electronic form from said processor as a data file.

2. A method as claimed in claim 1 comprising determining said control sequence in order to cause said raw magnetic resonance data to be entered into said memory organized at k-space at said readout points with said defined sparse sampling wherein multiple different sampling intervals along said readout axis are established according to an arrangement rule that is executed by said processor.

3. A method as claimed in claim 2 wherein a central point, with a center coordinate that coincides with a coordinate of the center of k-space, is associated with said readout axis, and wherein said processor executes said arrangement rule so that said sampling interval increases with increasing distance from said central point.

4. A method as claimed in claim 3 comprising, in said processor, executing said arrangement rule so that said sampling interval increases incoherently with increasing distance from said central point.

5. A method as claimed in claim 2 comprising, in said processor, using, as said arrangement rule, an arrangement rule based on a Gaussian function.

6. A method as claimed in claim 2 comprising, in said processor, executing said arrangement rule based on a linear progressing interval function that establishes said sampling interval.

7. A method as claimed in claim 2 wherein a central point having a center coordinate, that coincides with a coordinate of the center of k-space, is associated with the readout axis, and comprising, in said processor, executing said arrangement rule so that multiple sampling intervals are set asymmetrically relative to said central point.

8. A method as claimed in claim 2 wherein a central point having a center coordinate that coincides with a coordinate of the center of k-space as associating with the readout axis, and comprising, in said processor, applying multiple arrangement rules along said readout axis including a first arrangement rule that predetermines uniform at sampling intervals along said readout axis, and a second arrangement rule that predetermines varying sampling intervals along said readout axis.

9. A method as claimed in claim 8 comprising, in said processor, applying said multiple arrangement rules respectively for different segments along said readout axis.

10. A method as claimed in claim 9 comprising applying said first arrangement rule in a segment along said readout axis in a region of said central point, and applying said second arrangement rule in a segment of said readout axis that is farther from said central point than said region.

11. A method as claimed in claim 2 comprising generating said arrangement rule in said processor using a pseudorandom generator.

12. A method as claimed in claim 2 comprising modifying said arrangement rule in said processor using a pseudorandom generator.

13. A method as claimed in claim 1 wherein a central point having a center coordinate that coincides with a coordinate of the center of k-space as associated with the readout axis, and comprising determining said control sequence in order to cause said raw magnetic resonance data to be entered at said multiple readout points with said defined sparse sampling along said readout axis in k-space in a first segment of said readout axis while leaving a second segment of said readout axis free of said readout points, with said second segment being situated along said readout axis by mirroring of said first segment with respect to said central point.

14. A method to for operating a magnetic resonance (MR) imaging apparatus, comprising:
   in a processor, determining a control sequence to operate an MR data acquisition scanner, in which an examination subject is situated, to acquire raw magnetic resonance data from the examination subject at a first point in time and at a second point in time, as measurement values for multiple readout points in k-space;
   in said processor, determining said control sequence in order to cause said raw magnetic resonance data acquired at said first point in time to be entered into an electronic memory organized as k-space at first readout points arranged along a readout axis in k-space, as first readout pairs, each comprised of two of said measurement values respectively at two of said readout points, with a defined sparse sampling in k-space defined by said readout points in each first readout pair having a same predetermined first pair spacing relative to each other, and by first readout pairs that are adjacent along said readout axis in k-space having a sampling interval for said first readout pairs that is different from said first pair spacing, with said sampling interval for said first readout pairs varying along said readout axis;
   in said processor, determining said control sequence in order to cause said raw magnetic resonance data acquired at said second point in time to be entered into said electronic memory organized as k-space at second readout points arranged along said readout axis in k-space, as second readout pairs, each also comprised of two of said measurement values respectively at two of said readout points, with said defined sparse sampling in k-space further defined by said readout points in each second readout pair having a same predetermined second pair spacing relative to each other that differs from said first pair spacing, and by second readout pairs that are adjacent along said readout axis in k-space having a sampling interval that is different from said second pair spacing, with said sampling interval for said second readout pairs varying along said readout axis;

from said processor, making said control sequence available in electronic form as controls signals and operating said MR data acquisition scanner according to said control signals in order, during an execution of said control sequence, to acquire said measurement values and to enter said measurement values in said memory organized as k-space, with said defined sparse sampling, with said execution of said control sequence having a shorter time duration than execution of said control sequence without said defined sparse sampling; and from said processor, accessing contents of said memory organized as k-space and executing a reconstruction algorithm that processes said contents to generate MR image data of the examination subject from said contents, and making said MR image date available in electronic form from said processor as a data file.

15. A magnetic resonance (MR) imaging apparatus, comprising:

an MR data acquisition scanner in which an examination subject is situated;

a control computer configured to execute a control sequence that includes operating said MR data acquisition scanner to acquire raw magnetic resonance data from the examination subject that include measurement values for multiple readout points in k-space;

an electronic memory;

said control computer being configured to execute a control sequence so as to enter said raw magnetic resonance data into said electronic memory organized as k-space at said readout points arranged along a readout axis in k-space, as readout pairs, each comprised of two of said measurement values respectively at two of said readout points, with a defined sparse sampling in k-space defined by said readout points in each readout pair having a same predetermined pair spacing relative to each other, with readout pairs that are adjacent along said readout axis in k-space having a sampling interval that is different from said pair spacing, with said sampling interval varying along said readout axis;

said control computer being configured to make said control sequence available in electronic form as control signals and to operate said MR data acquisition scanner according to said control signals in order, during an execution of said control sequence, to acquire said measurement values and to enter said measurement values in said memory organized as k-space, with said defined sparse sampling, with said execution of said control sequence having a shorter time duration than execution of said control sequence without said defined sparse sampling; and an image reconstruction computer configured to access contents of said memory organized as k-space and to execute a reconstruction algorithm that processes said contents to generate MR image data of the examination subject from said contents, and to make said MR image data available in electronic form from said image reconstruction computer as a data file.

16. An MR imaging apparatus as claimed in claim 15 wherein said computer is configured to determine said control sequence in order to cause said raw magnetic resonance data to be entered into said memory organized at k-space at said readout points with said defined sparse sampling wherein multiple different sampling intervals along said readout axis are established according to an arrangement rule that is executed by said control computer.

17. An MR imaging apparatus as claimed in claim 16 wherein said control computer is configured to determine or modify said arrangement rule using a pseudorandom generator.

18. A magnetic resonance (MR) imaging apparatus, comprising:

an MR data acquisition scanner in which an examination subject is situated;

a control computer configured to execute a control sequence that includes operating said MR data acquisition scanner to acquire raw magnetic resonance data from the examination subject at a first point in time and at a second point in time, as measurement values for multiple readout points in k-space;

an electronic memory;

said control computer being configured execute a control sequence so as to enter said raw magnetic resonance data acquired at said first point in time into said electronic memory organized as k-space at first readout points arranged along a readout axis in k-space, as first readout pairs, each comprised of two of said measurement values respectively at two of said readout points, with a defined sparse sampling in k-space defined by said readout points in each first readout pair having a same predetermined first pair spacing relative to each other, with first readout pairs that are adjacent along said readout axis in k-space for said first readout pairs having a sampling interval that is different from said first pair spacing, with said sampling interval for said first readout pairs varying along said readout axis;

said control computer being configured to enter said raw magnetic resonance data acquired at said second point in time into said electronic memory organized as k-space at second readout points arranged along said readout axis in k-space, as second readout pairs, each also comprised of two of said measurement values respectively at two of said readout points, with said defined sparse sampling in k-space further defined by said readout points in each second readout pair having a same predetermined second pair spacing relative to each other that differs from said first pair spacing, and by second readout pairs that are adjacent along said readout axis in k-space having a sampling interval for said second readout pairs that is different from said second pair spacing, with said sampling interval varying along said readout axis;

said control computer being configured to make said control sequence available in electronic form as control signals and to operate said MR data acquisition scanner according to said control signals in order, during an execution of said control sequence, to acquire said measurement values and to enter said measurement values in said memory organized as k-space, with said defined sparse sampling, with said execution of said control sequence having a shorter time duration than execution of said control sequence without said defined sparse sampling; and an image reconstruction computer configured to access contents of said memory organized as k-space and to execute a reconstruction algorithm that processes said contents to generate MR image data of the examination subject from said contents, and to make said MR image data available in electronic form from said image reconstruction computer as a data file.

19. An MR imaging apparatus as claimed in claim 18 wherein said computer is configured to determine said control sequence in order to cause said raw magnetic resonance data to be entered into said memory organized at k-space at said readout points with said defined sparse sampling wherein multiple different sampling intervals along said readout axis are established according to an arrangement rule that is executed by said control computer.

20. An MR imaging apparatus as claimed in claim 19 wherein said control computer is configured to determine or modify said arrangement rule using a pseudorandom generator.

21. A non-transitory, computer-readable data storage medium encoded with programming instructions, said data storage medium being loaded into a computerized computer of a magnetic resonance (MR) apparatus, that comprises an MR data acquisition scanner, said programming instructions causing said computer to:

determine a control sequence to operate said MR data acquisition scanner with an examination subject situated therein, to acquire raw magnetic resonance data from the examination subject that include measurement values for multiple readout points in k-space;

determine said control sequence so as to cause said raw magnetic resonance data to be entered into an electronic memory organized as k-space at said readout points arranged along a readout axis in k-space, as readout pairs, each comprised of two of said measurement values respectively at two of said readout points, with a defined sparse sampling in k-space defined by said readout points in each readout pair having a same predetermined pair spacing relative to each other, and by readout pairs that are adjacent along said readout axis in k-space having a sampling interval that is different from said pair spacing, with said sampling interval varying along said readout axis;

make said control sequence available in electronic form as control signals and operate said MR data acquisition scanner according to said control signals in order, during an execution of said control sequence, to acquire said measurement values and to enter said measurement values in said memory organized as k-space, with said defined sparse sampling, with said execution of said control sequence having a shorter time duration than execution of said control sequence without said defined sparse sampling; and access contents of said memory organized as k-space and executing a reconstruction algorithm that processes said contents to generate MR image data of the examination subject from said contents, and make said MR image date available in electronic form from said computer as a data file.

22. A non-transitory, computer-readable data storage medium as claimed in claim 21, wherein said programming instructions cause said computer to execute said control sequence in order to cause said raw magnetic resonance data to entered into said memory organized as k-space at said readout points with said defined sparse sampling wherein multiple different sampling intervals along said readout axis are established according to an arrangement rule that is executed by said computer.

23. A non-transitory, computer-readable data storage medium as claimed in claim 22 wherein said programming instructions cause said computer to determine or modify said arrangement rule using a pseudorandom generator.

24. A non-transitory, computer-readable data storage medium encoded with programming instructions, said data storage medium being loaded into a computer of a magnetic resonance (MR) apparatus, that comprises an MR data acquisition scanner, said programming instructions causing said computer to:

determine a control sequence to operate said MR data acquisition scanner with an examination subject situated therein, to acquire raw magnetic resonance data from the examination subject at a first point in time and at a second point in time, as measurement values for multiple readout points in k-space;

determine said control sequence so as to cause said raw magnetic resonance data acquired at said first point in time into an electronic memory organized as k-space at first readout points arranged along a readout axis in k-space, as first readout pairs, each comprised of two said measurement values respectively at two of said readout points with a defined sparse sampling in k-space defined by said readout points in each first readout pair having a same predetermined first pair spacing relative to each other, with first readout pairs that are adjacent along said readout axis in k-space having a sampling interval for said first readout pairs that is different from said first pair spacing, with said sampling interval for said first readout pairs varying along said readout axis;

determine said control sequence so as to also cause said raw magnetic resonance data acquired at said second point in time to be entered into said electronic memory organized as k-space at second readout points arranged along said readout axis in k-space, as second readout pairs, each also comprised of two of said measurement values respectively at two of said readout points, with said defined sparse sampling in k-space further defined by said readout points in each second readout pair having a same predetermined second pair spacing relative to each other that differs from said first pair spacing, with second readout pairs that are adjacent along said readout axis in k-space having a sampling interval for said second readout pairs that is different from said second pair spacing, and by said sampling interval for said second readout pairs varying along said readout axis;

make said control sequence available in electronic form as control signals and operate said MR data acquisition scanner according to said control signals in order, during an execution of said control sequence, to acquire said measurement values and to enter said measurement values in said memory organized as k-space, with said defined sparse sampling, with said execution of said control sequence having a shorter time duration than execution of said control sequence without said defined sparse sampling; and access contents of said memory organized as k-space and execute a reconstruction algorithm that processes said contents to generate MR image data of the examination subject from said contents, and to make said MR image data available in electronic form from said computer as a data file.

25. A non-transitory, computer-readable data storage medium as claimed in claim 24, wherein said programming instructions cause said computer to execute said control sequence in order to cause said raw magnetic resonance data to entered into said memory organized as k-space at said readout points with said defined sparse sampling wherein multiple different sampling intervals along said readout axis are established according to an arrangement rule that is executed by said computer.

26. A non-transitory, computer-readable data storage medium as claimed in claim 25 wherein said programming instructions cause said computer to determine or modify said arrangement rule using a pseudorandom generator.

* * * * *